US010453911B2

(12) United States Patent
 Cha et al.

(10) Patent No.: US 10,453,911 B2
(45) Date of Patent: Oct. 22, 2019

(54) DISPLAY DEVICE

(71) Applicant: Samsung Display Co., Ltd., Yongin-si, Gyeonggi-do (KR)

(72) Inventors: Myoung Geun Cha, Seoul (KR); Sang Gun Choi, Suwon-si (KR); Thanh Tien Nguyen, Seoul (KR); Kyoung Won Lee, Seoul (KR); Yong Su Lee, Seoul (KR); Joo Hye Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/965,160

(22) Filed: Apr. 27, 2018

(65) Prior Publication Data
US 2019/0115412 A1 Apr. 18, 2019

(30) Foreign Application Priority Data
Oct. 13, 2017 (KR) .................. 10-2017-0133170

(51) Int. Cl.
*H01L 27/32* (2006.01)
*G09G 3/3233* (2016.01)
*G09G 3/3258* (2016.01)

(52) U.S. Cl.
CPC ....... *H01L 27/3276* (2013.01); *G09G 3/3233* (2013.01); *G09G 3/3258* (2013.01);
(Continued)

(58) Field of Classification Search
CPC ............. H01L 27/3265; H01L 27/3262; H01L 51/5218; H01L 51/5234; H01L 27/3233; H01L 27/3272; G09G 3/3233
See application file for complete search history.

(56) References Cited

U.S. PATENT DOCUMENTS

2014/0097419 A1* 4/2014 Kim .................. H01L 27/326
  257/40
2014/0132584 A1* 5/2014 Kim .................. G09G 3/3696
  345/212

(Continued)

FOREIGN PATENT DOCUMENTS

KR 10-2012-0070709 A 7/2012
KR 10-2013-0061637 A 6/2013
KR 10-2016-0027907 A 3/2016

*Primary Examiner* — William Lu
(74) *Attorney, Agent, or Firm* — Lewis Roca Rothgerber Christie LLP

(57) ABSTRACT

A display device includes first semiconductor pattern including a first channel portion, a first electrode connected to a driving voltage line, and a second electrode connected to a light emitting element, a first insulating, a first conductive layer including a first gate electrode, a second insulating layer, a second conductive layer including an initialization power line, a third insulating layer, an upper semiconductor layer including a second semiconductor pattern including a second channel portion, a third electrode, and a fourth electrode connected to the first gate electrode, and a third semiconductor pattern including a third channel portion, a fifth electrode connected to the third electrode, and a sixth electrode connected to the second electrode, a fourth insulating layer, and a third conductive layer including a scan line and a control signal line, wherein the upper semiconductor layer does not overlap the first gate electrode and the initialization power line.

20 Claims, 13 Drawing Sheets

(52) U.S. Cl.
CPC ...... *H01L 27/3262* (2013.01); *H01L 27/3265* (2013.01); *G09G 2300/0852* (2013.01); *G09G 2310/0251* (2013.01); *G09G 2310/0262* (2013.01)

(56) References Cited

U.S. PATENT DOCUMENTS

| | | | |
|---|---|---|---|
| 2015/0144892 A1* | 5/2015 | Chang | H01L 27/3265 257/40 |
| 2016/0240598 A1* | 8/2016 | You | H01L 27/3276 |
| 2017/0053591 A1* | 2/2017 | Seo | G09G 3/3225 |
| 2017/0373094 A1* | 12/2017 | Park | G09G 3/3233 |
| 2018/0061921 A1* | 3/2018 | Son | H01L 27/3265 |
| 2019/0088209 A1* | 3/2019 | Kang | G09G 3/3283 |

* cited by examiner

T1: 121, 151a, 151b, 151c
T2: 430, 153a, 153b, 153c
T3: 410, 155a, 155b, 155c
151: 151a, 151b, 151c
153: 153a, 153b, 153c
155: 155a, 155b, 155c

120: 121
200: 210
300: 310, 330, 350, 370
400: 410, 430, 451, 453, 455, 457, 459
500: 510
600: 610, 630, 651, 653

DISPLAY DEVICE

CROSS-REFERENCE TO RELATED APPLICATION

This application claims priority to, and the benefit of, Korean Patent Application No. 10-2017-0133170, filed on Oct. 13, 2017, in the Korean Intellectual Property Office, the disclosure of which is incorporated herein by reference in its entirety.

BACKGROUND

1. Field

The present inventive concept relates to a display device.

2. Description of the Related Art

With the development of multimedia, display devices are becoming increasingly important. Accordingly, various types of display devices, such as liquid crystal displays and organic light emitting diode displays, are being used. Of these display devices, an organic light emitting diode display includes a plurality of pixels, each having an organic light emitting element, which is a self-light emitting element. In each of the pixels, a plurality of transistors and at least one storage capacitor for driving the organic light emitting element are formed.

As the demand for high-resolution models increases, it is required to arrange the transistors and the storage capacitor within a limited space. In addition, it is required to reduce or minimize the effect of an element in a pixel on the characteristics of a transistor to reduce or prevent degradation of display quality.

SUMMARY

Aspects of the inventive concept provide a display device having a high-resolution structure without degradation of display quality.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a display device including a substrate, a first semiconductor pattern on the substrate, and including a first channel portion, a first electrode on a side of the first channel portion and electrically connected to a driving voltage line, and a second electrode on the other side of the first channel portion and electrically connected to a light emitting element, a first insulating layer on the first semiconductor pattern, a first conductive layer on the first insulating layer, and including a first gate electrode overlapping the first channel portion, a second insulating layer on the first conductive layer, a second conductive layer on the second insulating layer, and including an initialization power line overlapping the first gate electrode, a third insulating layer on the second conductive layer, an upper semiconductor layer on the third insulating layer, and including a second semiconductor pattern including a second channel portion, a third electrode on a side of the second channel portion, and a fourth electrode on the other side of the second channel portion and electrically connected to the first gate electrode, and a third semiconductor pattern including a third channel portion, a fifth electrode on a side of the third channel portion and electrically connected to the third electrode, and a sixth electrode on the other side of the third channel portion and electrically connected to the second electrode, a fourth insulating layer on the upper semiconductor layer, and a third conductive layer on the fourth insulating layer, and including a scan line overlapping the second channel portion, and a control signal line overlapping the third channel portion and spaced apart from the scan line, wherein the upper semiconductor layer does not overlap the first gate electrode and the initialization power line.

The display device may further include a fifth insulating layer on the third conductive layer, a fourth conductive layer on the fifth insulating layer, and including a data line, a fifth insulating layer on the fourth conductive layer, and a fifth conductive layer on the fifth insulating layer, and including the driving voltage line electrically connected to the first electrode, and an upper initialization power line electrically connected to the initialization power line.

The upper semiconductor layer might not overlap the upper initialization power line.

The third conductive layer may further include a first connection pattern electrically connecting the second electrode and the sixth electrode, a second connection pattern electrically connecting the first gate electrode and the third electrode, a third connection pattern electrically connecting the fourth electrode and the fifth electrode, a fourth connection pattern electrically connecting the driving voltage line and the first electrode, and a fifth connection pattern electrically connecting the upper initialization power line and the initialization power line.

The display device may further include a contact layer buried in the third insulating layer, and including a first contact plug contacting the first electrode and the fourth connection pattern, a second contact plug contacting the second electrode and the third connection pattern, a third contact plug contacting the first gate electrode and the second connection pattern, and a fourth contact plug contacting the initialization power line and the fifth connection pattern.

An upper surface of at least any one of the first contact plug, the second contact plug, the third contact plug, and the fourth contact plug may lie in the same plane with an upper surface of the third insulating layer.

The fifth conductive layer may further include a conductive pattern spaced apart from the driving voltage line and the initialization power line, and overlapping the data line.

The conductive pattern may be electrically connected to the fourth electrode or the fifth electrode.

The fifth conductive layer may further include a conductive pattern electrically connected to the second electrode.

The display device may further include a sixth insulating layer on the fifth conductive layer, wherein the light emitting element is on the sixth insulating layer and is connected to the conductive pattern.

According to another aspect of the inventive concept, there is provided a display device including a substrate, a first semiconductor pattern on the substrate, and including a first channel portion, a first electrode on a side of the first channel portion and electrically connected to a driving voltage line, and a second electrode on the other side of the first channel portion and electrically connected to a light emitting element, a first insulating layer on the first semiconductor pattern, a first conductive layer on the first insulating layer, and including a first gate electrode overlapping the first channel portion, a second insulating layer on the first conductive layer, a second conductive layer on the second insulating layer, and including an initialization power line overlapping the first gate electrode, a third insulating layer on the second conductive layer, a gate pattern layer on the third insulating layer, and including a first gate pattern and a second gate pattern, each overlapping the first gate electrode or the initialization power line, a fourth insulating layer on the gate pattern layer, an upper semiconductor layer on the fourth insulating layer, and including a second semiconductor pattern including a second channel portion, a third electrode on a side of the second channel portion, and a fourth electrode on the other side of the second channel portion and electrically connected to the first gate electrode, and a third semiconductor pattern including a third channel portion, a fifth electrode on a side of the third channel portion and electrically connected to the third electrode, and a sixth electrode on the other side of the third channel portion and electrically connected to the second electrode, a fifth insulating layer on the upper semiconductor layer, and a third conductive layer on the fifth insulating layer, and including a scan line overlapping the second channel portion, and a control signal line overlapping the third channel portion and spaced apart from the scan line, wherein the second semiconductor pattern overlaps the first gate pattern, and wherein the third semiconductor pattern overlaps the second gate pattern.

The first gate pattern may be electrically connected to the fourth electrode, and wherein the second gate pattern is electrically connected to the sixth electrode.

The third conductive layer may further include a first connection pattern that electrically connects the second electrode, the sixth electrode, and the second gate pattern, a second connection pattern that electrically connects the first gate electrode, the first gate pattern and the fourth electrode, a third connection pattern that electrically connects the third electrode and the fifth electrode, a fourth connection pattern that electrically connects the driving voltage line and the first electrode, and a fifth connection pattern electrically connected to the initialization power line.

The first connection pattern may contact the sixth electrode and the second gate pattern, wherein the second connection pattern contacts the fourth electrode and the first gate pattern, wherein the third connection pattern contacts the third electrode and the fifth electrode, and wherein the fourth connection pattern contacts the driving voltage line.

The display device may further include a sixth insulating layer on the third conductive layer, a fourth conductive layer on the sixth insulating layer, and including a data line, a seventh insulating layer on the fourth conductive layer, and a fifth conductive layer on the seventh insulating layer, and including the driving voltage line contacting the fourth connection pattern, and an upper initialization power line contacting the fifth connection pattern.

The display device may further include a contact layer buried in the third insulating layer, wherein the contact layer includes a first contact plug contacting the first electrode and the fourth connection pattern, a second contact plug contacting the second electrode and the first connection pattern, a third contact plug contacting the first gate electrode and the second connection pattern, and a fourth contact plug contacting the initialization power line and the fifth connection pattern.

An upper surface of at least any one of the first contact plug, the second contact plug, the third contact plug, and the fourth contact plug may lie in the same plane with an upper surface of the third insulating layer.

The fifth conductive layer may further include a conductive pattern spaced apart from the driving voltage line and the initialization power line, and overlaps the data line, wherein the conductive pattern contacts the third connection pattern.

The fifth conductive layer may further include a conductive pattern contacting the first connection pattern.

The display device may further include a sixth insulating layer on the fifth conductive layer, wherein the light emitting element is on the sixth insulating layer and is connected to the conductive pattern.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
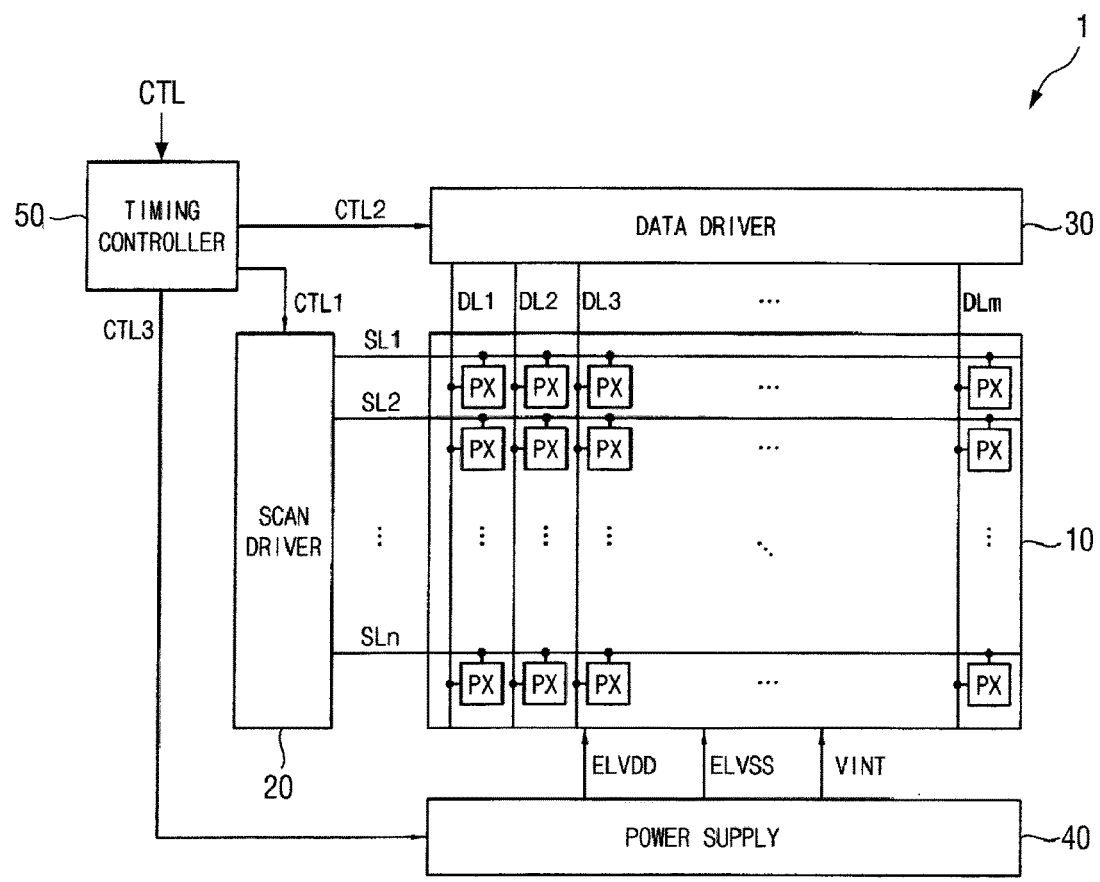
FIG. 1 is a schematic block diagram of a display device according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," or "coupled to," another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "at least any one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, directions DR1 and DR2 are not limited to row and column directions, and may be interpreted in a broader sense. For example, the directions DR1 and DR2 may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

An organic light emitting display will be described below as an example of a display device.

FIG. 1 is a schematic block diagram of a display device 1 according to an embodiment.

Referring to FIG. 1, the display device 1 may include a display panel 10 having a plurality of pixels PX and a panel driver for driving the display panel 10.

In an embodiment, the panel driver may drive the display panel 10 in a simultaneous emission mode including a non-emission period in which the pixels PX do not emit light, and an emission period in which the pixels PX emit light. In an embodiment, the panel driver may include a scan driver 20, a data driver 30, a power supply 40, and a timing controller 50.

The display panel 10 may include a plurality of pixels PX to display an image. For example, the display panel 10 may include n×m pixels PX located at respective crossing regions of first through $n^{th}$ (where n is an integer greater than 1) scan lines SL1 through SLn and first through $m^{th}$ (where m is an integer greater than 1) data lines DL1 through DLm. The pixels PX may be connected to a driving voltage ELVDD and an initialization power VINT having voltage levels that vary within one frame period, and may be driven in the simultaneous emission mode. The structure and driving method of the pixels PX will be described later.

The scan driver 20 may provide scan signals to the pixels PX through the first through $n^{th}$ scan lines SL1 through SLn based on a first control signal CTL1.

The data driver 30 may convert digital image data into analog data signals, and may provide the data signals to the pixels PX through the first through $m^{th}$ data lines DL1 through DLm based on a second control signal CTL2 (e.g., from the timing controller 50).

The power supply 40 may provide the driving voltage ELVDD, a common voltage ELVSS, and the initialization power VINT, which may have voltage levels that vary within one frame period, to the pixels PX based on a third control signal CTL3 (e.g., from the timing controller 50). For example, the power supply 40 may include a DC-DC converter, which generates output voltages having various voltage levels from an input voltage (e.g., a battery voltage), and may also include switches that select the output voltages as the driving voltage ELVDD, the common voltage ELVSS, and the initialization power VINT based on the third control signal CTL3 to set the voltage level of each of the driving voltage ELVDD, the common voltage ELVSS, and the initialization power VINT.

The timing controller 50 may control the scan driver 20, the data driver 30, and the power supply 40. For example, the timing controller 50 may receive a control signal CTL from an external circuit, such as a system board. The timing controller 50 may generate the first through third control signals CTL1 through CTL3 to control the scan driver 20, the data driver 30, and the power supply 40, respectively. The first control signal CTL1 for controlling the scan driver 20 may include a scan start signal and a scan clock signal. The second control signal CTL2 for controlling the data driver 30 may include a horizontal start signal, a load signal, and image data. The third control signal CTL3 for controlling the power supply 40 may include a switch control signal for controlling the voltage levels of the driving voltage ELVDD, the common voltage ELVSS, and the initialization power VINT. The timing controller 50 may generate digital image data suitable for the operating condition of the display panel 10 based on input image data, and may provide the digital image data to the data driver 30.

The display device 1 can improve display quality by compensating a threshold voltage of a driving transistor, and by including pixels driven in an emission mode (e.g. a concurrent, or "simultaneous," emission mode). For example, a head mounted display (HMD) may be mounted on the head of a user, may enlarge an image (that is, an image displayed on a display panel) using a lens, and may provide the image directly in front of the user's eyes. Therefore, if the display panel is driven in a sequential emission mode, a motion blur, a color blur, etc. may be experienced by the user. However, the display device 1 drives the pixels PX having a relatively simple structure in the simultaneous emission mode. Therefore, a high-resolution display device having high display quality can be realized.

Figure 2:
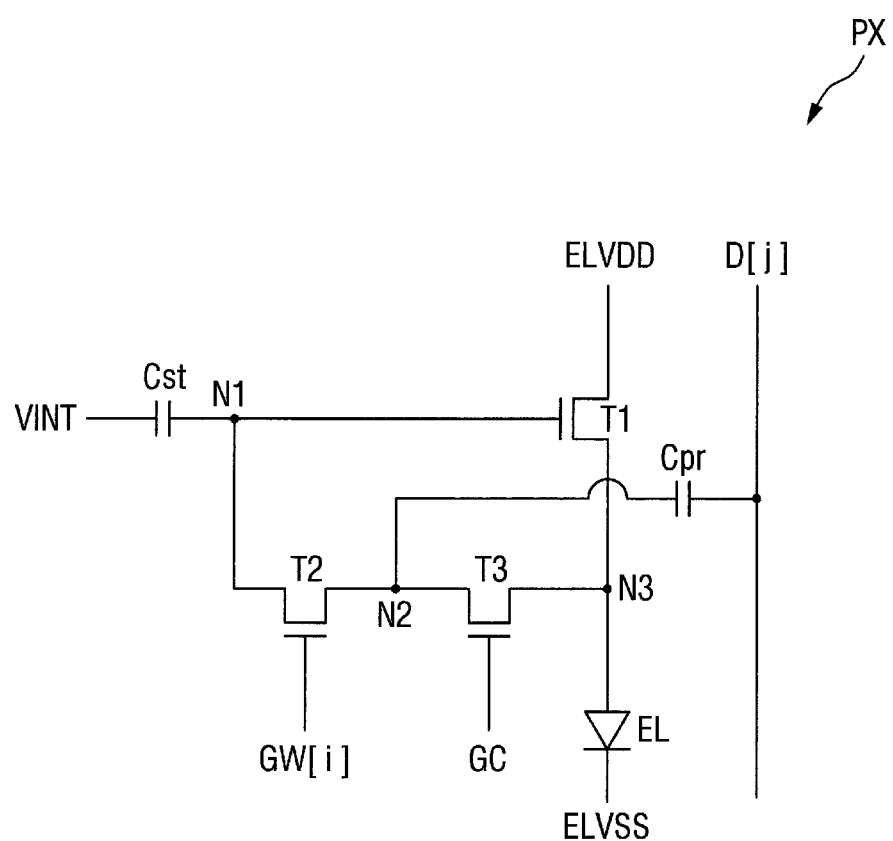
FIG. 2 is an equivalent circuit diagram of a pixel in the display device according to the embodiment.

FIG. 2 is an equivalent circuit diagram of a pixel PX illustrated in FIG. 1.

Referring to FIG. 2, the pixel PX may include a light emitting element EL, a first switching element T1, a second switching element T2, a third switching element T3, a first capacitor Cst, and a second capacitor Cpr. The pixel PX may be located in an $i^{th}$ pixel row and a $j^{th}$ pixel column.

The first switching element T1, the second switching element T2, and the third switching element T3 may be thin-film transistors. In some embodiments, each of the first switching element T1, the second switching element T2, and the third switching element T3 may be a PMOS transistor. Alternatively, each of the first switching element T1, the second switching element T2, and the third switching element T3 may be an NMOS transistor. Alternatively, one or more of the first switching element T1, the second switching element T2, and the third switching element T3 may be NMOS transistors, and the rest may be PMOS transistors.

The first switching element T1 may include a gate electrode connected to a first node N1, a first electrode connected to a driving voltage line to which the driving voltage ELVDD is provided, and a second electrode connected to a third node N3. The first switching element T1 may be a driving transistor.

The second switching element T2 may include a gate electrode for receiving an $i^{th}$ scan signal GW[i] from an $i^{th}$ scanning line, a third electrode connected to a second node N2, and a fourth electrode connected to the first node N1. The second switching element T2 may connect the first node N1 and the second node N2 in response to the $i^{th}$ scan signal GW[i].

The third switching element T3 may include a gate electrode for receiving a common control signal GC from a control signal line, a fifth electrode connected to the second node N2, and a sixth electrode connected to the third node N3. The third switching element T3 may connect the second node N2 and the third node N3 in response to the common control signal GC.

The first capacitor Cst may be located between the initialization power VINT and the first node N1. In an embodiment, the first capacitor Cst may include a first capacitive electrode to which the initialization power VINT is provided, and a second capacitive electrode, which is connected to the first node N1. In some embodiments, the first capacitor Cst may be a storage capacitor.

The second capacitor Cpr may be located between a data line and the second node N2. In an embodiment, the second capacitor Cpr may include a third capacitive electrode which receives a data signal D[j] from the data line and a fourth capacitive electrode, which is connected to the second node N2. In some embodiments, the second capacitor Cpr may be a luminance compensation capacitor, and the capacitance of the second capacitor Cpr may be greater than the capacitance of the first capacitor Cst.

The light emitting element EL may emit light based on a driving current flowing from the first switching element T1. In an embodiment, the light emitting element EL may include a first element electrode connected to the third node N3, and a second element electrode connected to a common power source to which the common voltage ELVSS is provided.

In the pixel PX illustrated in FIG. 2, the third switching element T3 is located between the third electrode of the second switching element T2 and the first element electrode of the light emitting element EL. Accordingly, the second node N2 and the third node N3 may be separated by the third switching element T3. Therefore, even if a leakage current flowing from the driving voltage line, to which the driving voltage ELVDD is provided, to the third node N3 via the first switching element T1 is generated while the data signal D[j] is being written to the first gate electrode of the first switching element T1 (i.e., to the first node N1), the data signal D[j] being written to the first gate electrode of the first switching element T1 is not affected by the leakage current. This can improve display quality.

In addition, because the second capacitor Cpr is located between the data line and the second node N2, it is possible to compensate for a reduction in the luminance of the light emitting element EL due to the parasitic capacitance between the first node N1 or the first switching element T1 connected to the first node N1 and other elements. This can further improve display quality.

Figure 3:
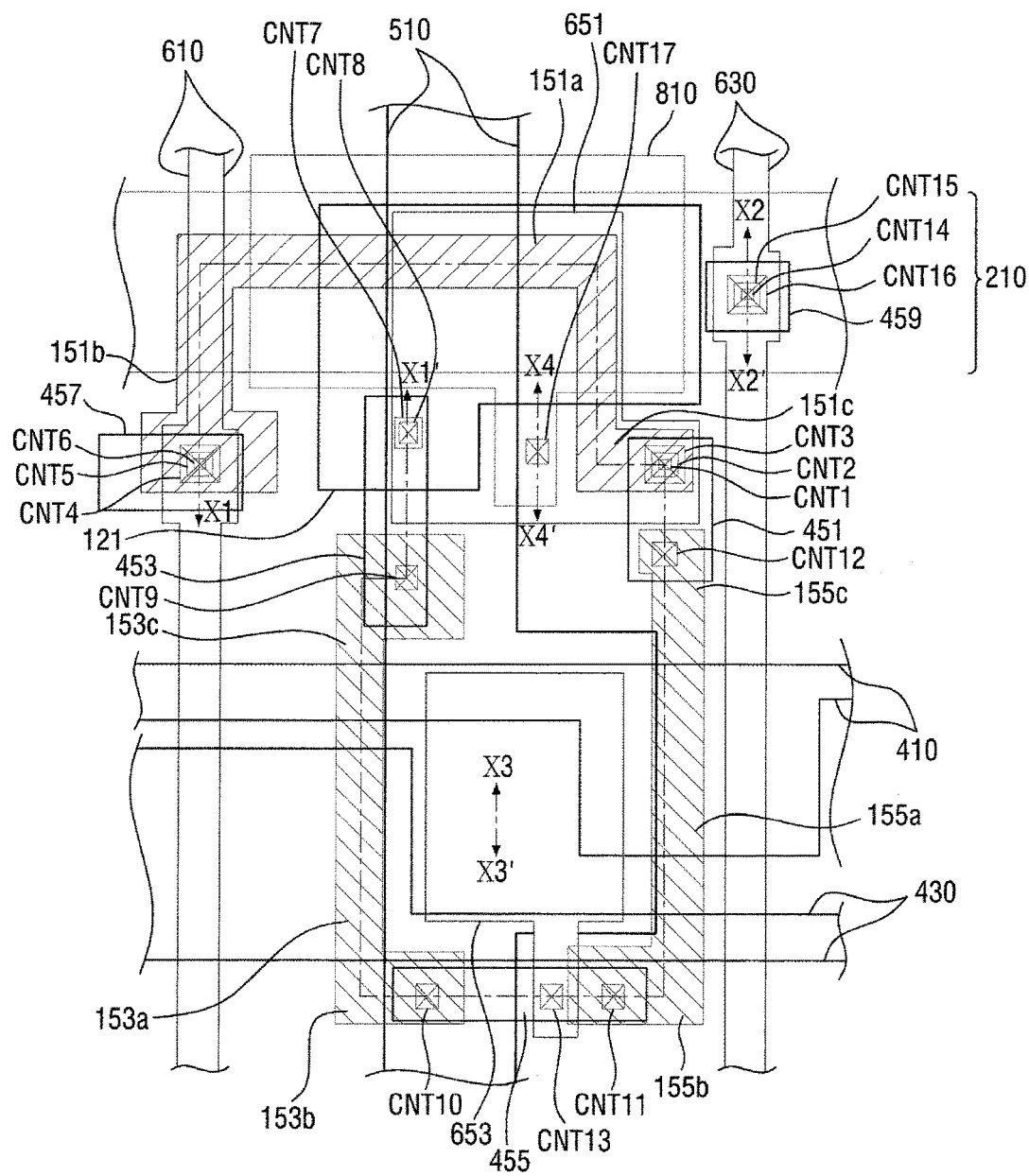
FIG. 3 is a layout view of the pixel illustrated in FIG. 2.
Figure 4:
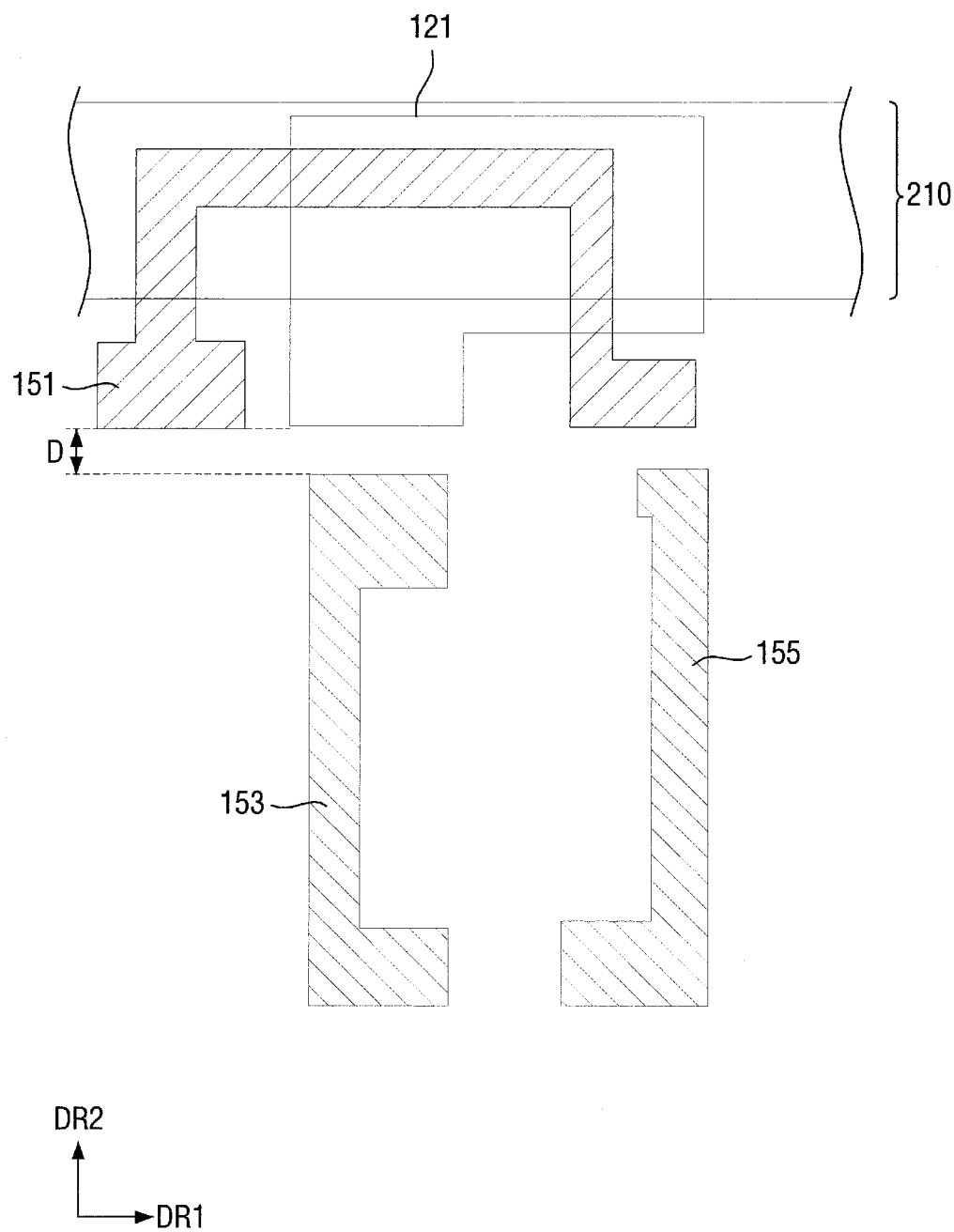
FIG. 4 is a layout view of a first semiconductor pattern, an upper semiconductor layer, a first conductive layer and a second conductive layer illustrated in FIG. 3.
Figure 5:
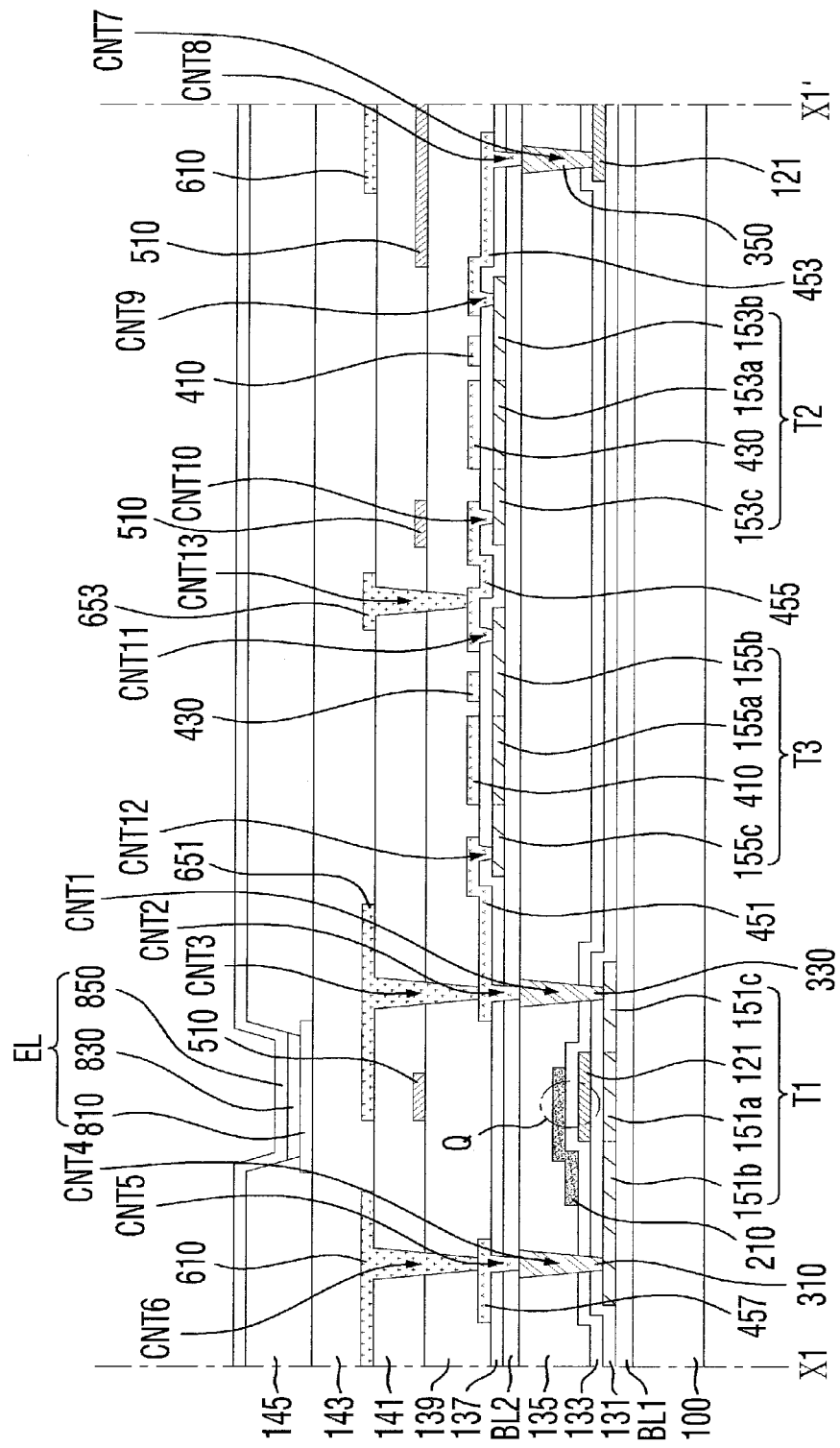
FIG. 5 is a cross-sectional view taken along the line X1-X1' of FIG. 3.
Figure 6:
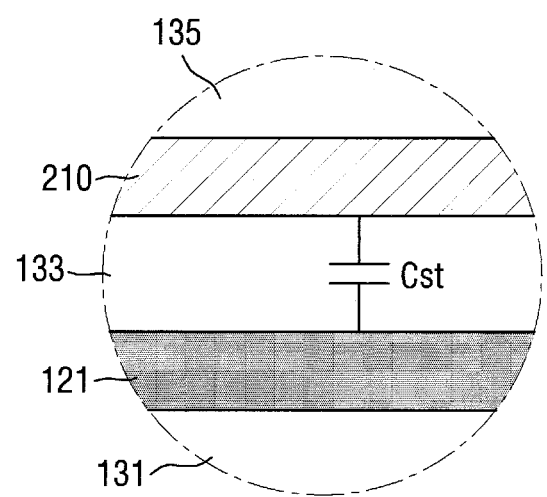
FIG. 6 is an enlarged view of a portion Q of FIG. 3.
Figure 7:
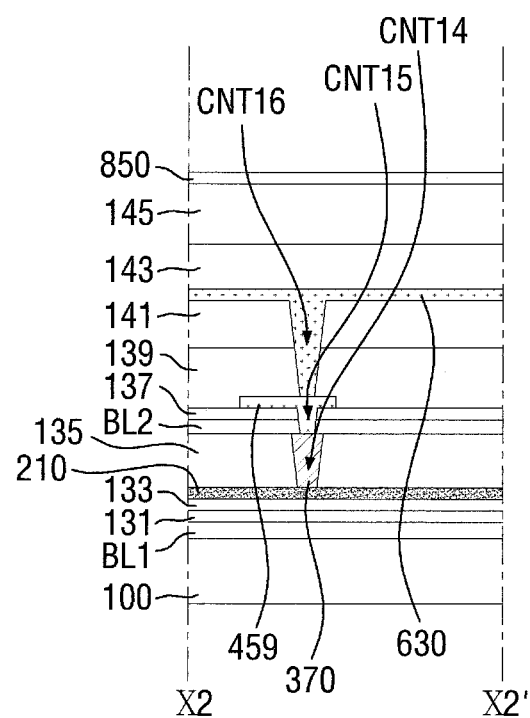
FIG. 7 is a cross-sectional view taken along the line X2-X2' of FIG. 3.
Figure 8:
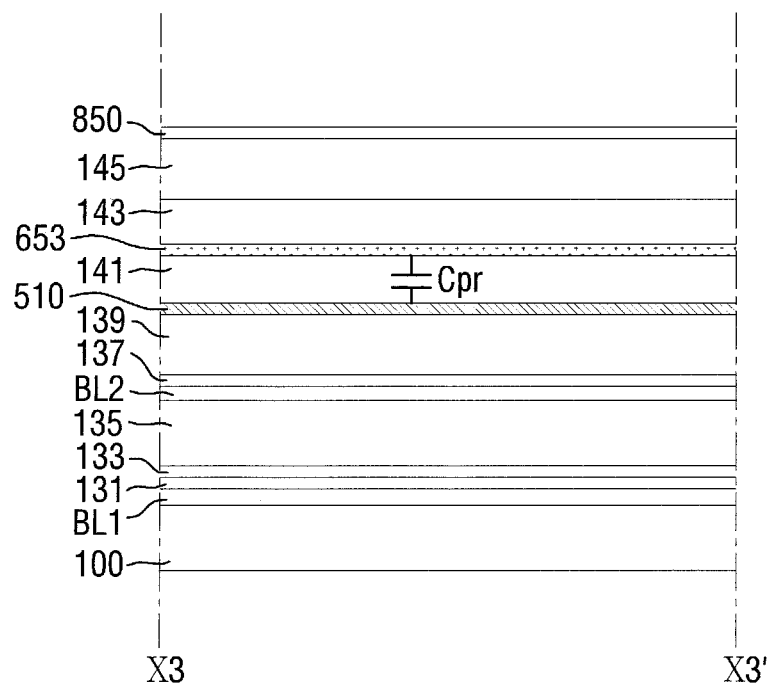
FIG. 8 is a cross-sectional view taken along the line X3-X3' of FIG. 3.
Figure 9:
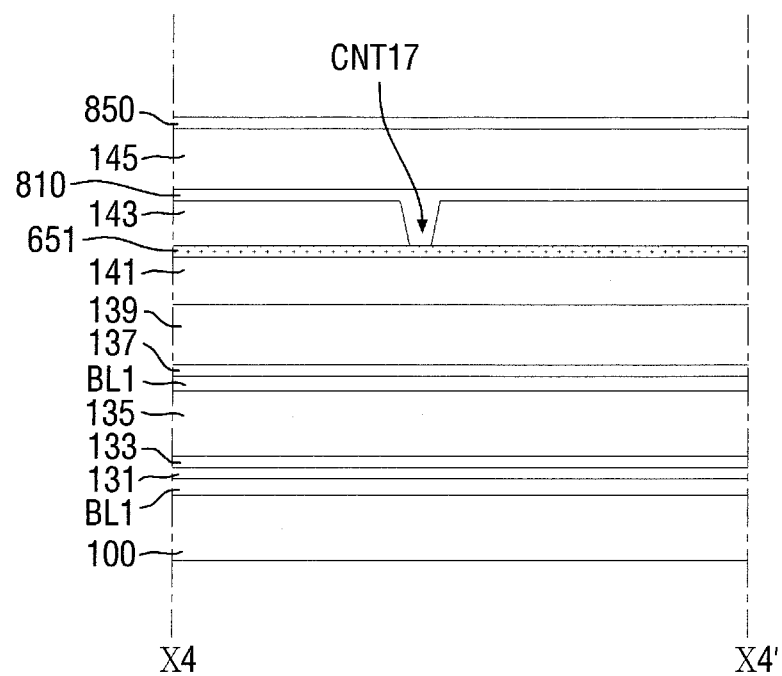
FIG. 9 is a cross-sectional view taken along the line X4-X4' of FIG. 3.

FIG. 3 is a layout view of the pixel PX illustrated in FIG. 2. FIG. 4 is a layout view of a first semiconductor pattern 151, an upper semiconductor layer (153 and 155), a first conductive layer 120, and a second conductive layer 200 illustrated in FIG. 3. FIG. 5 is a cross-sectional view taken along the line X1-X1' of FIG. 3. FIG. 6 is an enlarged view of a portion Q of FIG. 3. FIG. 7 is a cross-sectional view taken along the line X2-X2' of FIG. 3. FIG. 8 is a cross-sectional view taken along the line X3-X3' of FIG. 3. FIG. 9 is a cross-sectional view taken along the line X4-X4' of FIG. 3. In the following embodiments, to easily describe the arrangement of and connections between elements, some elements are given new reference numerals even though they are substantially the same as the elements described above with reference to FIGS. 1 and 2.

Referring to FIGS. 3 through 9, the pixel PX includes the first switching element T1, the second switching element T2, the third switching element T3, the first capacitor Cst, and the second capacitor Cpr as described above.

The stacked structure of each pixel PX of the display device 1 will now be described.

A substrate 100 may be made of an insulating material such as glass, quartz, or polymer resin. Examples of the polymer material include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations of these materials. The substrate 100 may also include a metal material.

The substrate 100 may be a rigid substrate or a flexible substrate that can be bent, folded, or rolled. An example of the material that forms the flexible substrate may be polyimide (PI).

A buffer layer BL1 may be located on the substrate 100. The buffer layer BL1 may be located on an entirety of the surface of the substrate 100. The buffer layer BL1 may reduce or prevent diffusion of impurity ions, may reduce or prevent penetration of moisture or outside air, and may perform a surface planarization function. The buffer layer BL1 may include silicon nitride, silicon oxide, or silicon oxynitride. The buffer layer BL1 can be omitted depending on the type of the substrate 100 or depending on process conditions.

The first semiconductor pattern 151 of the first switching element T1 may be located on the buffer layer BL1.

The first semiconductor pattern 151 includes a first channel portion 151a, a first electrode 151b located on a side of the first channel portion 151a and connected to the first channel portion 151a, and a second electrode 151c located on the other side of the first channel portion 151a and connected to the first channel portion 151a.

As described herein, when two elements are connected to each other, it means that the two elements are physically connected to each other, or are physically in contact with each other. In addition, when two elements are electrically connected to each other, it means that the two elements are physically connected to each other, or are not physically connected to each other, but are electrically connected by a conductor.

The first semiconductor pattern 151 may include polycrystalline silicon. The polycrystalline silicon may be formed by crystallizing amorphous silicon. Examples of the crystallization method include rapid thermal annealing (RTA), solid phase crystallization (SPC), excimer laser annealing (ELA), metal-induced crystallization (MIC), metal-induced lateral crystallization (MILC), and sequential lateral solidification (SLS). In an example, the first semiconductor pattern 151 may include monocrystalline silicon, low-temperature polycrystalline silicon, amorphous silicon, or the like. In an embodiment, the first semiconductor pattern 151 may include an oxide semiconductor. In an embodiment, the first semiconductor pattern 151 may include a binary compound (ABx), a ternary compound (ABxCy), or a quaternary compound (ABxCyDz) containing indium, zinc, gallium, tin, titanium, aluminum, hafnium (Hf), zirconium (Zr), magnesium (Mg), etc. In an example, the semiconductor layer 150 may include ITZO (an oxide including indium, tin and titanium) or IGZO (an oxide including indium, gallium and tin).

In the first semiconductor pattern 151, the first electrode 151b and the second electrode 151c may be respectively doped with impurity ions (e.g., p-type impurity ions in the case of a PMOS transistor). In some embodiments, a trivalent dopant, such as boron (B), may be used as the p-type impurity ions.

A first insulating layer 131 may be located on the first semiconductor pattern 151. The first insulating layer 131 may generally be located over the entire surface of the substrate 100. The first insulating layer 131 may be a gate insulating layer having a gate insulating function.

The first insulating layer 131 may include an inorganic insulating material, such as a silicon compound or a metal oxide. For example, the first insulating layer 131 may include silicon oxide, silicon nitride, silicon oxynitride, aluminum oxide, tantalum oxide, hafnium oxide, zirconium oxide, titanium oxide, and the like. These materials may be used alone or in combination with each other. The first insulating layer 131 may be a single layer, or may be a multilayer consisting of a stack of different materials.

The first conductive layer 120 may be located on the first insulating layer 131.

The first conductive layer 120 may include the first gate electrode 121 of the first switching element T1, and the first gate electrode 121 may overlap the first channel portion 151a of the first semiconductor pattern 151.

The first conductive layer 120 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first conductive layer 120 may be a single layer or a multilayer.

A second insulating layer 133 insulates the first conductive layer 120 from the second conductive layer 200. The second insulating layer 133 may be located on the first conductive layer 120, and may generally be located over the entire surface of the substrate 100. The second insulating layer 133 may be an interlayer insulating film.

The second insulating layer 133 may include an inorganic insulating material such as silicon oxide, silicon nitride, silicon oxynitride, hafnium oxide, aluminum oxide, titanium oxide, tantalum oxide or zinc oxide or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The second insulating layer 133 may be a single layer, or may be a multilayer consisting of a stack of different materials.

The second conductive layer 200 is located on the second insulating layer 133. The second conductive layer 200 may include an initialization power line 210, which carries the initialization power VINT (see FIG. 2).

The initialization power line 210 may extend along a row direction or along a first direction DR1.

The initialization power line 210 forms the first capacitor Cst by overlapping the first gate electrode 121 of the first switching element T1 located under the initialization power line 210 with the second insulating layer 133 interposed between them. The first gate electrode 121 of the first switching element T1 may be the first capacitive electrode of the first capacitor Cst, the initialization power line 210 overlapping the first gate electrode 121 of the first switching element T1 may be the second capacitive electrode of the first capacitor Cst, and the second insulating layer 133 interposed between the first gate electrode 121 of the first switching element T1 and the initialization power line 210 may be a dielectric of the first capacitor Cst.

The second conductive layer 200 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu).

A third insulating layer 135 may be located on the second conductive layer 200. The third insulating layer 135 covers the second conductive layer 200. The third insulating layer 135 may generally be located over the entire surface of the substrate 100. In some embodiments, the third insulating layer 135 may include the same material as the first insulating layer 131, or may include one or more of the materials exemplified as the materials of the first insulating layer 131.

A first contact hole CNT1 partially exposing the second electrode 151c of the first switching element T1, and a fourth contact hole CNT4 partially exposing the first electrode 151b of the first switching element T1, may be formed in the first insulating layer 131, in the second insulating layer 133, and in the third insulating layer 135. In addition, a seventh contact hole CNT7 partially exposing the first gate electrode 121 may be formed in the second insulating layer 133 and the third insulating layer 135, and a fourteenth contact hole CNT14 partially exposing the initialization power line 210 may be formed in the third insulating layer 135.

A contact layer 300 may be located in the first contact hole CNT1, the fourth contact hole CNT4, the seventh contact hole CNT7, and the fourteenth contact hole CNT14. The contact layer 300 may include a first contact plug 310, a second contact plug 330, a third contact plug 350, and a fourth contact plug 370.

The first contact plug 310 may be located in the fourth contact hole CNT4 to fill the fourth contact hole CNT4, and may contact the first electrode 151b. The second contact plug 330 may be located in the first contact hole CNT1 to fill the first contact hole CNT1, and may contact the second electrode 151c. The third contact plug 350 may be located in the seventh contact hole CNT7 to fill the seventh contact hole CNT7, and may contact the first gate electrode 121. The fourth contact plug 370 may be located in the fourteenth contact hole CNT14 to fill the fourteenth contact hole CNT14, and may contact the initialization power line 210.

In some embodiments, an upper surface of the first contact plug 310 might not protrude above an upper surface of the third insulating layer 135. In addition, the upper surface of the third insulating layer 135 and the upper surface of the first contact plug 310 may lie in substantially the same plane. In other words, a height from a surface of the substrate 100 to the upper surface of the third insulating layer 135 may be substantially the same as a height from the surface of the substrate 100 to the upper surface of the first contact plug 310.

Similarly, an upper surface of the second contact plug 330, an upper surface of the third contact plug 350, and an upper surface of the fourth contact plug 370 might not protrude above the upper surface of the third insulating layer 135. In addition, the upper surface of the third insulating layer 135 may lie in substantially the same plane with at least any one of the upper surface of the second contact plug 330, the upper surface of the third contact plug 350, and the upper surface of the fourth contact plug 370.

In some embodiments, each of the first contact plug 310, the second contact plug 330, the third contact plug 350, and the fourth contact plug 370 may have a single damascene structure.

The contact layer 300 may include the same material as the first conductive layer 120, or may include one or more of the materials exemplified as the materials of the first conductive layer 120.

A buffer layer BL2 may be located on the third insulating layer 135. The buffer layer BL2 may be located on the entire surface of the third insulating layer 135. The buffer layer BL2 may reduce or prevent diffusion of impurity ions, may reduce or prevent penetration of moisture or outside air, and may perform a surface planarization function. The buffer layer BL2 may include the same material as the buffer layer BL1, or may include one or more of the materials exemplified as the materials of the buffer layer BL1.

The upper semiconductor layer (153 and 155) may be located on the buffer layer BL2. The upper semiconductor layer (153 and 155) may include a second semiconductor pattern 153 of the second switching element T2, and a third semiconductor pattern 155 of the third switching element T3. In some embodiments, the second semiconductor pattern 153 and the third semiconductor pattern 155 may be spaced apart from each other.

The second semiconductor pattern 153 includes a second channel portion 153a, a third electrode 153b located on a side of the second channel portion 153a and connected to the second channel portion 153a, and a fourth electrode 153c located on the other side of the second channel portion 153a and connected to the second channel portion 153a.

The third semiconductor pattern 155 may include a third channel portion 155a, a fifth electrode 155b located on a side of the third channel portion 155a and connected to the third channel portion 155a, and a sixth electrode 155c located on the other side of the third channel portion 155a and connected to the third channel portion 155a.

The upper semiconductor layer (153 and 155) may include the same material as the first semiconductor pattern 151, or may include one or more of the materials exemplified as the materials of the first semiconductor pattern 151.

The upper semiconductor layer (153 and 155) might not overlap the first gate electrode 121. In addition, the upper semiconductor layer (153 and 155) might not overlap the initialization power line 210. This can reduce or minimize the effect that a signal transmitted to the first gate electrode 121 or to the initialization power line 210 may have on the operation of the second switching element T2 or the third switching element T3. Consequently, a high-resolution structure can be implemented, and deterioration of display quality can be reduced or prevented. In some embodiments, a shortest distance D between the first gate electrode 121 or the initialization power line 210 and the upper semiconductor layer (153 and 155) in a plan view may be about 0 µm to about 4 µm, or about 2 µm to about 4 µm. However, the distance D can be adjusted within a range that reduces or prevents the interference between the first gate electrode 121 or the initialization power line 210 and the upper semiconductor layer (153 and 155).

A fourth insulating layer 137 may be located on the upper semiconductor layer (153 and 155). The fourth insulating layer 137 covers the upper semiconductor layer (153 and 155). The fourth insulating layer 137 may be located over the entire surface of the substrate 100. The fourth insulating layer 137 may be a gate insulating layer having a gate insulating function. The fourth insulating layer 137 may include the same material as the first insulating layer 131, or may include one or more of the materials exemplified as the materials of the first insulating layer 131.

A fifth contact hole CNT5 partially exposing the first contact plug 310, a second contact hole CNT2 partially exposing the second contact plug 330, an eighth contact hole CNT8 partially exposing the third contact plug 350, and a fifteenth contact hole CNT15 partially exposing the fourth contact plug 370 may be formed in the buffer layer BL2 and the fourth insulating layer 137. In addition, a ninth contact hole CNT9 partially exposing the third electrode 153b of the second switching element T2, a tenth contact hole CNT10 partially exposing the fourth electrode 153c of the second switching element T2, an eleventh contact hole CNT11 partially exposing the fifth electrode 155b of the third switching element T3, and a twelfth contact hole CNT12 partially exposing the sixth electrode 155c of the third switching element T3, may be formed in the fourth insulating layer 137.

In some embodiments, the first contact hole CNT1 may overlap the second contact hole CNT2, the fourth contact hole CNT4 may overlap the fifth contact hole CNT5, the seventh contact hole CNT7 may overlap the eighth contact hole CNT8, and the fourteenth contact hole CNT14 may overlap the fifteenth contact hole CNT15. Accordingly, the area occupied by the contact holes in a plan view can be reduced.

A third conductive layer 400 may be located on the fourth insulating layer 137. The third conductive layer 400 may include a control signal line 410, which carries the common control signal GC (see FIG. 2), and a scan line 430, which carries the scan signal GW[i] (see FIG. 2).

The control signal line 410 and the scan line 430 may extend along the first direction DR1, and may be spaced apart from each other with respect to a column direction or a second direction DR2 that crosses the first direction DR1.

A portion of the scan line 430 may extend in a width direction to overlap the second channel portion 153a of the second semiconductor pattern 153, and may function as the gate electrode of the second switching element T2.

A portion of the control signal line 410 may extend in the width direction to overlap the third channel portion 155a of the third semiconductor pattern 155, and may function as the gate electrode of the third switching element T3.

The third conductive layer 400 may further include a first connection pattern 451, a second connection pattern 453, a third connection pattern 455, a fourth connection pattern 457, and a fifth connection pattern 459. The first connection pattern 451, the second connection pattern 453, the third connection pattern 455, the fourth connection pattern 457, and the fifth connection pattern 459 may be spaced apart from each other.

The first connection pattern 451 may contact the second contact plug 330 through the second contact hole CNT2, and may contact the sixth electrode 155c through the twelfth contact hole CNT12. Accordingly, the second electrode 151c and the sixth electrode 155c may be electrically connected to each other by the second contact plug 330 and the first connection pattern 451.

The second connection pattern 453 may contact the third contact plug 350 through the eighth contact hole CNT8, and may contact the third electrode 153b through the ninth contact hole CNT9. Accordingly, the first gate electrode 121 and the third electrode 153b may be electrically connected to each other by the third contact plug 350 and the second connection pattern 453.

The third connection pattern 455 may contact the fourth electrode 153c through the tenth contact hole CNT10, and may contact the fifth electrode 155b through the eleventh contact hole CNT11. Accordingly, the fourth electrode 153c and the fifth electrode 155b may be electrically connected to each other by the third connection pattern 455.

The fourth connection pattern 457 may contact the first contact plug 310 through the fifth contact hole CNT5, and the fifth connection pattern 459 may contact the fourth contact plug 370 through the fifteenth contact hole CNT15.

The third conductive layer 400 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The third conductive layer 400 may be a single layer or a multilayer.

A fifth insulating layer 139 may be located on the third conductive layer 400. The fifth insulating layer 139 insulates the third conductive layer 400 from a fourth conductive layer 500. The fifth insulating layer 139 may be located on the third conductive layer 400, and may generally be located over the entire surface of the substrate 100. The fifth insulating layer 139 may be an interlayer insulating film.

The fifth insulating layer 139 may include the same material as the second insulating layer 133, or may include one or more of the materials exemplified as the materials of the second insulating layer 133.

The fourth conductive layer 500 may be located on the fifth insulating layer 139. The fourth conductive layer 500 may include a data line 510, which carries the data signal D[j] (see FIG. 2).

The data line 510 may extend along the second direction DR2, which is the column direction in the present embodiment. The data line 510 may extend beyond the boundary of the pixel along the column direction toward neighboring pixels. In some embodiments, the data line 510 may include a portion that is wider than the other portions thereof.

The fourth conductive layer 500 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The fourth conductive layer 500 may be a single layer or a multilayer. For example, the fourth conductive layer 500 may have a stacked structure of Ti/Al/Ti, Mo/Al/Mo, Mo/AlGe/Mo, or Ti/Cu.

A sixth insulating layer 141 may be located on the fourth conductive layer 500. The sixth insulating layer 141 covers the fourth conductive layer 500. The sixth insulating layer 141 may generally be located over the entire surface of the substrate 100. In some embodiments, the sixth insulating layer 141 may include an inorganic insulating material such as silicon oxide, silicon nitride, silicon oxynitride, hafnium oxide, aluminum oxide, titanium oxide, tantalum oxide or zinc oxide or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The sixth insulating layer 141 may be a single layer, or may be a multilayer consisting of a stack of different materials.

A third contact hole CNT3 partially exposing the first connection pattern 451, a sixth contact hole CNT6 partially exposing the fourth connection pattern 457, a sixteenth contact hole CNT16 partially exposing the fifth connection pattern 459, and a thirteenth contact hole CNT13 partially exposing the third connection pattern 455, may be formed in the fifth insulating layer 139 and the sixth insulating layer 141.

In some embodiment, in a plan view, the third contact hole CNT3 may overlap the first contact hole CNT1 and the second contact hole CNT2, the sixth contact hole CNT6 may overlap the fourth contact hole CNT4 and the fifth contact hole CNT5, and the sixteenth contact hole CNT16 may overlap the fourteenth contact hole CNT14 and the fifteenth contact hole CNT15.

A fifth conductive layer 600 may be located on the sixth insulating layer 141. The fifth conductive layer 600 may include a driving voltage line 610, which carries the driving voltage ELVDD (see FIG. 2), and may further include an upper initialization power line 630, which carries the initialization power VINT (see FIG. 2) to the initialization power line 210. In addition, the fifth conductive layer 600 may further include a first conductive pattern 651 and a second conductive pattern 653.

The driving voltage line 610 may extend along the second direction DR2, which is the column direction. The driving voltage line 610 may extend beyond the boundary of the pixel along the column direction to neighboring pixels. The driving voltage line 610 may be electrically connected to the first electrode 151b of the first switching element T1. In some embodiments, the driving voltage line 610 may contact the fourth connection pattern 457 through the sixth contact hole CNT6. Accordingly, the driving voltage line 610 and the first electrode 151b may be electrically connected to each other by the first contact plug 310 and the fourth connection pattern 457.

The upper initialization power line 630 may extend along the second direction DR2, which is the column direction, and may be spaced apart from the driving voltage line 610. The upper initialization power line 630 may extend beyond the boundary of the pixel along the column direction toward neighboring pixels. The upper initialization power line 630 may be electrically connected to the initialization power line 210. In some embodiments, the upper initialization power line 630 may contact the fifth connection pattern 459 through the sixteenth contact hole CNT16. Accordingly, the upper initialization power line 630 and the initialization power line 210 may be electrically connected to each other by the fourth contact plug 370 and the fifth connection pattern 459.

In some embodiments, the upper initialization power line 630 might not overlap the upper semiconductor layer (153 and 155). Accordingly, the effect that the initialization power VINT supplied to the upper initialization power line 630 has on the second switching element T2 or the third switching element T3 can be reduced or minimized.

The first conductive pattern 651 may be spaced apart from the upper initialization power line 630 and the driving voltage line 610. The first conductive pattern 651 may be electrically connected to the second electrode 151c of the first switching element T1. In some embodiments, the first conductive pattern 651 may contact the first connection pattern 451 through the third contact hole CNT3. Accordingly, the second electrode 151c and the first conductive pattern 651 may be electrically connected to each other by the second contact plug 330 and the first connection pattern 451.

The second conductive pattern 653 may be spaced apart from the first conductive pattern 651, the upper initialization power line 630, and the driving voltage line 610. The second conductive pattern 653 may be electrically connected to the fifth electrode 155b of the third switching element T3, or to the fourth electrode 153c of the second switching element T2. In some embodiments, the second conductive pattern 653 may contact the third connection pattern 455 through the thirteenth contact hole CNT13. Accordingly, the second conductive pattern 653 may be electrically connected to the fifth electrode 155b or the fourth electrode 153c by the third connection pattern 455.

The second conductive pattern 653 forms the second capacitor Cpr by overlapping the data line 510 located under the second conductive pattern 653 with the sixth insulating layer 141 interposed between them. The second conductive pattern 653 may be the first capacitive electrode of the second capacitor Cpr, the data line 510 overlapped by the second conductive pattern 653 may be the second capacitive electrode of the second capacitor Cpr, and the sixth insulating layer 141 interposed between the second conductive pattern 653 and the data line 510 may be a dielectric of the second capacitor Cpr. For luminance compensation, the capacitance of the second capacitor Cpr may be greater than the capacitance of the first capacitor Cst. In some embodiments, when the data line 510 includes a portion that is wider than the other portions thereof, the second conductive pattern 653 may overlap the wider portion of the data line 510. This increases the overlap area between the second conductive pattern 653 and the data line 510, resulting in an increase in the capacitance of the second capacitor Cpr.

The fifth conductive layer 600 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The fifth conductive layer 600 may be a single layer or a multilayer. For example, the fifth conductive layer 600 may have a stacked structure of Ti/Al/Ti, Mo/Al/Mo, Mo/AlGe/Mo, or Ti/Cu.

A seventh insulating layer 143 may be located on the fifth conductive layer 600. The seventh insulating layer 143 covers the fifth conductive layer 600. The seventh insulating layer 143 may generally be located over the entire surface of the substrate 100. In some embodiments, the seventh insulating layer 143 may be an organic insulating layer including an organic material. The organic material may include at least one of polyacrylates resin, epoxy resin, phenolic resin, polyamides resin, polyimides resin, unsaturated polyesters resin, polyphenylenethers resin, polyphenylenesulfides resin, and benzocyclobutene (BCB).

In some embodiments, a seventeenth contact hole CNT17 partially exposing the first conductive pattern 651 may be formed in the seventh insulating layer 143.

A first element electrode 810 may be located on the seventh insulating layer 143. The first element electrode 810 may be an anode of the light emitting element EL. The first element electrode 810 may be connected to the first conductive pattern 651 by the seventeenth contact hole CNT17. Accordingly, the first element electrode 810 may be electrically connected to the second electrode 151c of the first switching element T1 by the first conductive pattern 651, the first connection pattern 451, and the second contact plug 330.

A pixel defining layer 145 defining emission areas may be located on the seventh insulating layer 143 on which the first element electrode 810 is formed. The pixel defining layer 145 may have an opening exposing an upper surface of the first element electrode 810. The pixel defining layer 145 may include an organic material, such as polyimide, or hexamethyldisiloxane (HMDSO).

A light emitting layer 830 may be located on the first element electrode 810 in an area surrounded by the pixel defining layer 145. In some embodiments, the light emitting layer 830 may be made of a low molecular organic material or a polymer organic material such as poly(3,4-ethylenedioxythiophene) (PEDOT). In addition, the light emitting layer 830 may be a multilayer including one or more of a hole injection layer (HIL), a hole transporting layer (HTL), an electron transporting layer (ETL), and an electron injection layer (EIL). A second element electrode 850 may be located on the light emitting layer 830. In some embodiments, the second element electrode 850 may be a cathode.

The first element electrode 810, the light emitting layer 830, and the second element electrode 850 form the light emitting element EL.

In the display device 1 according to the current embodiment, the second switching element T2 and the third switching element T3 are located on a different layer from the first switching element T1. This improves space utilization, and enables realization a high-resolution display device. In addition, because the upper semiconductor layer (153 and 155) is placed to not overlap the first gate electrode 121 and the initialization power line 210, it is possible to reduce, minimize, or prevent the effect that a gate signal transmitted to the first gate electrode 121, and the effect that an initialization signal transmitted to the initialization power line 210, have on the second switching element T2 and the third switching element T3. Therefore, a high-resolution structure can be realized, and deterioration of display quality can be reduced or prevented.

Figure 10:
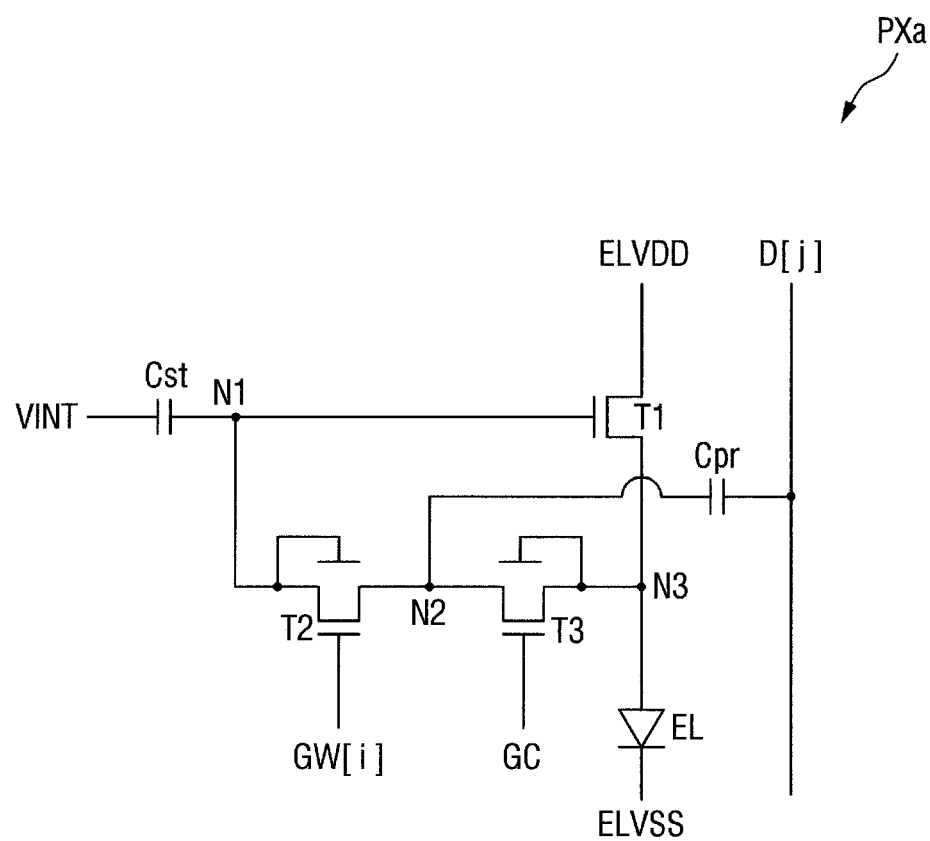
FIG. 10 is an equivalent circuit diagram of a pixel in a display device according to an embodiment.

FIG. 10 is an equivalent circuit diagram of a pixel PXa in a display device according to an embodiment. Referring to FIG. 10, the pixel PXa according to the current embodiment is substantially the same as the pixel PX of FIG. 2 except that a gate pattern is additionally provided on the side of a second switching element T2 and connected to a fourth electrode connected to a first node N1, and that a gate pattern is additionally provided on the side of a third switching element T3 and connected to a sixth electrode connected to a third node N3. Thus, any redundant description will be omitted.

Figure 11:
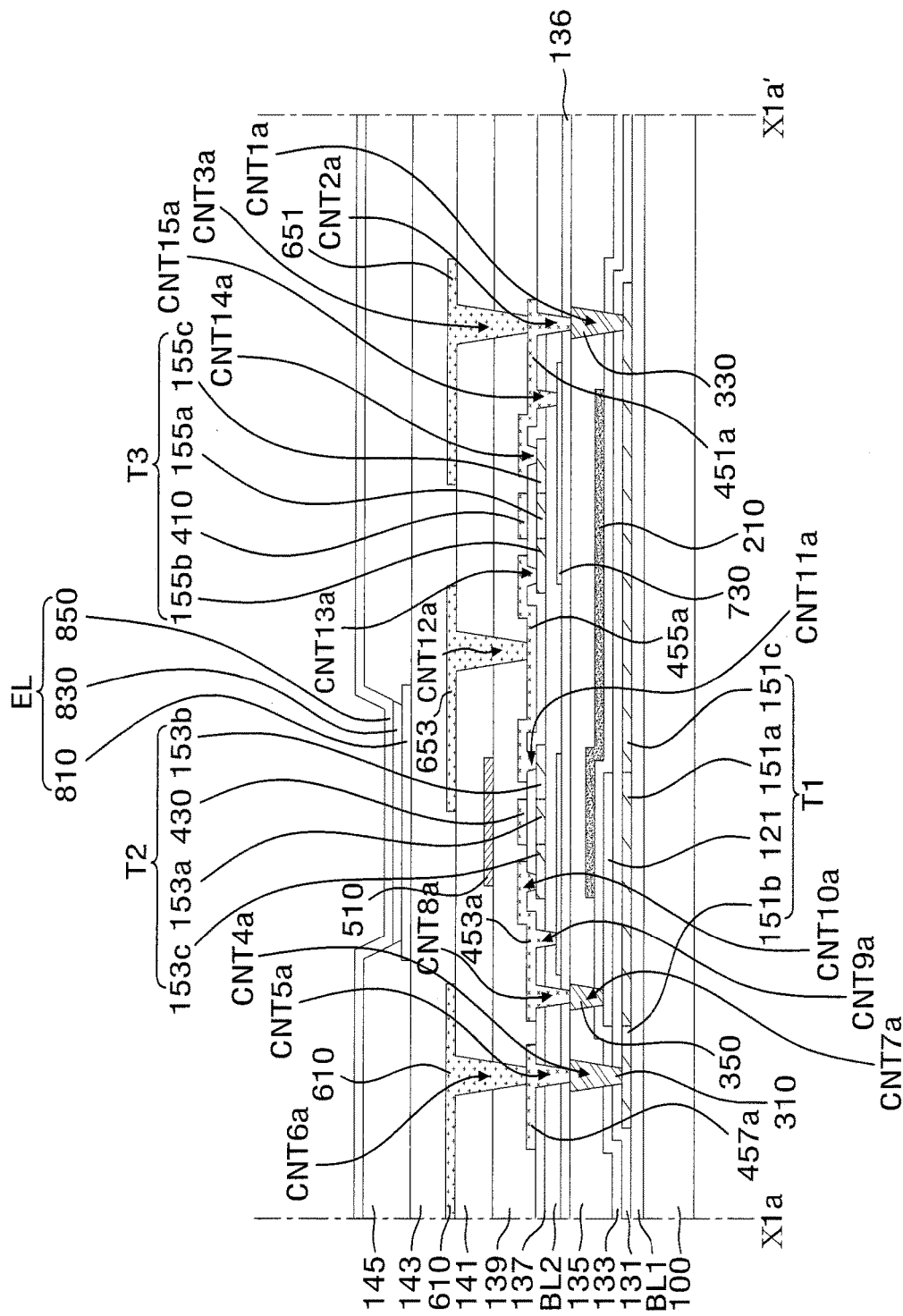
FIG. 11 is a cross-sectional view of a portion of the display device according to another embodiment, which corresponds to the cross sectional view taken along the line X1-X1' of FIG. 5.
Figure 12:
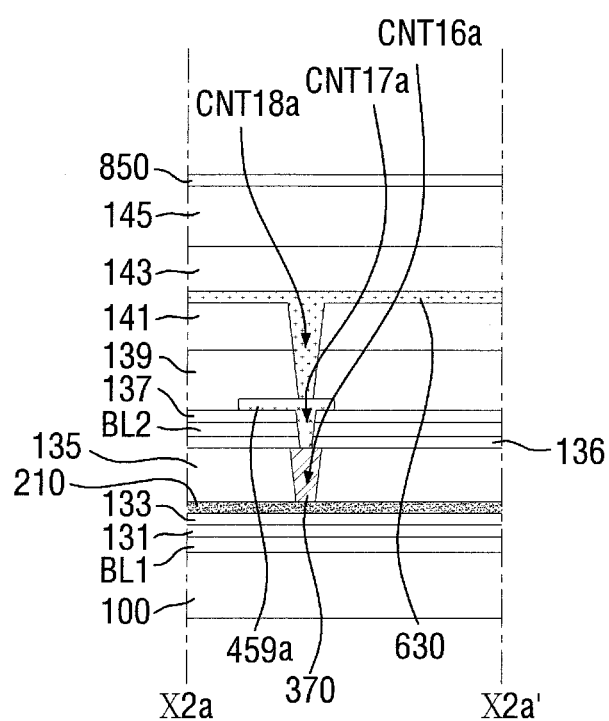
FIG. 12 is a cross-sectional view of a portion of the display device according to the embodiment of FIG. 11, which corresponds to FIG. 7.
Figure 13:
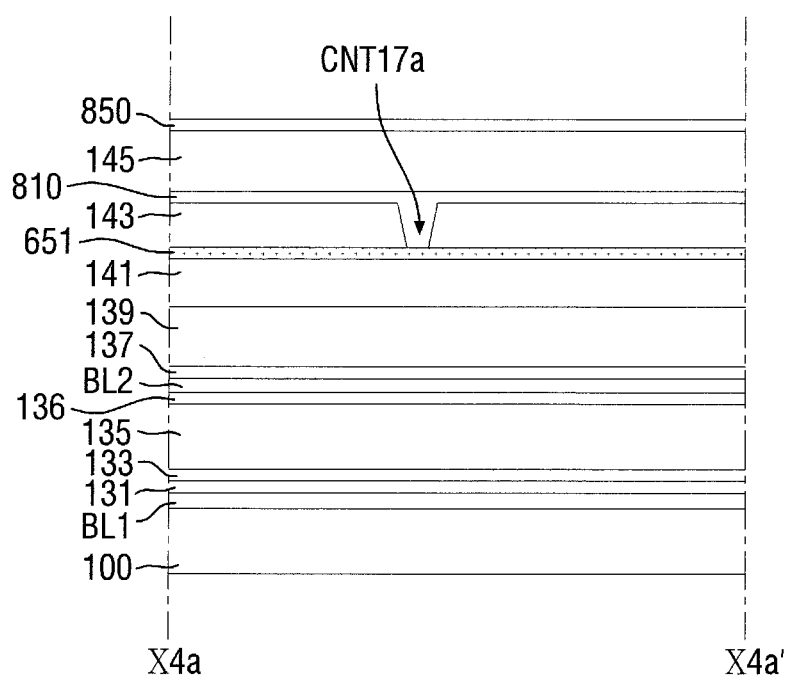
FIG. 13 is a cross-sectional view of a portion of the display device according to the embodiment of FIG. 11, which corresponds to FIG. 9.

FIG. 11 is a cross-sectional view of a portion of the display device according to another embodiment, and corresponds to the cross-sectional view of the previous embodiment shown in FIG. 5. That is, FIG. 11 is a cross-sectional view taken along the line X1a-X1a', which corresponds to the cross-sectional view taken the line X1-X1' of FIG. 5 in the previous embodiment, according to another embodiment. FIG. 12 is a cross-sectional view of a portion of the display device taken along the line X2a-X2a' according to the embodiment of FIG. 11, and corresponds to the cross-sectional view taken along the line X2-X2' of the previous embodiment shown in FIG. 7. FIG. 13 is a cross-sectional view of a portion of the display device taken along the line X4a-X4a' according to the embodiment shown in FIG. 11, and corresponds to the cross-sectional view taken along the line X4-X4' of the previous embodiment.

In the following description, elements and features identical to those described above will be mentioned briefly or will not be mentioned, and differences will be mainly described.

A buffer layer BL1 may be located on a substrate 100.

A first semiconductor pattern 151 of a first switching element T1 may be located on the buffer layer BL1.

The first semiconductor pattern 151 includes a first channel portion 151a, a first electrode 151b located on a side of the first channel portion 151a and connected to the first channel portion 151a, and a second electrode 151c located on the other side of the first channel portion 151a and connected to the first channel portion 151a.

A first insulating layer 131 may be located on the first semiconductor pattern 151, and a first conductive layer 120 may be located on the first insulating layer 131.

The first conductive layer 120 may include a first gate electrode 121 of the first switching element T1, and the first gate electrode 121 may overlap the first channel portion 151a of the first semiconductor pattern 151.

A second insulating layer 133 may be located on the first conductive layer 120, and a second conductive layer 200 may be located on the second insulating layer 133. The second conductive layer 200 may include an initialization power line 210, which carries initialization power VINT (see FIG. 2).

A third insulating layer 135 may be located on the second conductive layer 200.

A first contact hole CNT1a partially exposing the second electrode 151c of the first switching element T1, and a fourth contact hole CNT4a partially exposing the first electrode 151b of the first switching element T1, may be formed in the first insulating layer 131, in the second insulating layer 133, and in the third insulating layer 135. In addition, a seventh contact hole CNT7a partially exposing the first gate electrode 121 may be formed in the second insulating layer 133 and the third insulating layer 135, and a sixteenth contact hole CNT16a partially exposing the initialization power line 210 may be formed in the third insulating layer 135.

A contact layer 300 may be located in the first contact hole CNT1a, the fourth contact hole CNT4a, the seventh contact hole CNT7a, and the sixteenth contact hole CNT16a. The contact layer 300 may include a first contact plug 310, a second contact plug 330, a third contact plug 350, and a fourth contact plug 370.

The first contact plug 310 may be located in the fourth contact hole CNT4a to fill the fourth contact hole CNT4a, and may contact the first electrode 151b. The second contact plug 330 may be located in the first contact hole CNT1a to fill the first contact hole CNT1a, and may contact the second electrode 151c. The third contact plug 350 may be located in the seventh contact hole CNT7a to fill the seventh contact hole CNT7a, and may contact the first gate electrode 121. The fourth contact plug 370 may be located in the sixteenth contact hole CNT16a to fill the sixteenth contact hole CNT16a, and may contact the initialization power line 210.

In some embodiments, each of the first contact plug 310, the second contact plug 330, the third contact plug 350, and the fourth contact plug 370 may have a single damascene structure.

An intermediate insulating layer 136 may be located on the third insulating layer 135. The intermediate insulating layer 136 may generally be located over the entire surface of the substrate 100. The intermediate insulating layer 136 may include the same material as the first insulating layer 131, or may include one or more of the materials exemplified as the materials of the first insulating layer 131.

A gate pattern layer (710 and 730) may be located on the intermediate insulating layer 136.

The gate pattern layer (710 and 730) may include a first gate pattern 710 and a second gate pattern 730. The first gate pattern 710 may overlap the initialization power line 210 or the first gate electrode 121. Similarly, the second gate pattern 730 may overlap the initialization power line 210. The gate pattern layer (710 and 730) may be located between the initialization power line 210 or the first gate electrode 121 and an upper semiconductor layer (153 and 155) to block a signal transmitted to the initialization power line 210 or to the first gate electrode 121 from affecting the upper semiconductor layer (153 and 155).

A buffer layer BL2 may be located on the gate pattern layer (710 and 730).

The upper semiconductor layer (153 and 155) may be located on the buffer layer BL2. The upper semiconductor layer (153 and 155) may include a second semiconductor pattern 153 of the second switching element T2 and a third semiconductor pattern 155 of the third switching element T3. In some embodiments, the second semiconductor pattern 153 and the third semiconductor pattern 155 may be spaced apart from each other.

The second semiconductor pattern 153 includes a second channel portion 153a, a third electrode 153b located on a side of the second channel portion 153a and connected to the second channel portion 153a, and a fourth electrode 153c located on the other side of the second channel portion 153a and connected to the second channel portion 153a.

The second semiconductor pattern 153 overlaps the first gate pattern 710.

The third semiconductor pattern 155 includes a third channel portion 155a, a fifth electrode 155b located on a side of the third channel portion 155a and connected to the third channel portion 155a, and a sixth electrode 155c located on the other side of the third channel portion 155a and connected to the third channel portion 155a.

The third semiconductor pattern 155 overlaps the second gate pattern 730.

At least part of the upper semiconductor layer (153 and 155) may overlap the first gate electrode 121 or the initialization power line 210.

Therefore, if the gate pattern layer (710 and 730) is not present, the operation of the second switching element T2 or the third switching element T3 may be affected by a signal transmitted to the first gate electrode 121 or to the initialization power line 210. However, according to the current embodiment, the first gate pattern 710 is located in an area where the first gate electrode 121 or the initialization power line 210 is overlapped by the second semiconductor pattern 153, and the second gate pattern 730 is located in an area where the initialization power line 210 is overlapped by the third semiconductor pattern 155. Accordingly, the first gate pattern 710 and the second gate pattern 730 may function as blocking layers to reduce or prevent deterioration of display quality.

In addition, because a portion of the upper semiconductor layer (153 and 155) is placed to overlap the first gate electrode 121 or the initialization power line 210, space utilization can be improved, which, in turn, makes it possible to realize a high-resolution structure.

A fourth insulating layer 137 may be located on the upper semiconductor layer (153 and 155).

A fifth contact hole CNT5a partially exposing the first contact plug 310, a second contact hole CNT2a partially exposing the second contact plug 330, an eighth contact hole CNT8a partially exposing the third contact plug 350 and a seventeenth contact hole CNT17a partially exposing the fourth contact plug 370, may be formed in the intermediate insulating layer 136, the buffer layer BL2, and the fourth insulating layer 137. In addition, a ninth contact hole CNT9a partially exposing the first gate pattern 710, and a fifteenth contact hole CNT15a partially exposing the second gate pattern 730, may be formed in the buffer layer BL2 and the fourth insulating layer 137. An eleventh contact hole CNT11a partially exposing the third electrode 153b of the second switching element T2, a tenth contact hole CNT10a partially exposing the fourth electrode 153c of the second switching element T2, a thirteenth contact hole CNT13a partially exposing the fifth electrode 155b of the third switching element T3, and a fourteenth contact hole CNT14a partially exposing the sixth electrode 155c of the third switching element T3 may be formed in the fourth insulating layer 137.

A third conductive layer 400 may be located on the fourth insulating layer 137.

The third conductive layer 400 may include a control signal line 410, which carries a common control signal GC (see FIG. 2), and a scan line 430, which carries a scan signal GW[i] (see FIG. 2). The control signal line 410 and the scan line 430 may extend along the first direction DR1.

A portion of the scan line 430 may extend in the width direction to overlap the second channel portion 153a of the second semiconductor pattern 153, and may function as a gate electrode of the second switching element T2.

A portion of the control signal line 410 may extend in the width direction to overlap the third channel portion 155a of the third semiconductor pattern 155, and may function as a gate electrode of the third switching element T3.

The third conductive layer 400 may further include a first connection pattern 451a, a second connection pattern 453a, a third connection pattern 455a, a fourth connection pattern 457a, and a fifth connection pattern 459a spaced apart from each other.

The first connection pattern 451a may contact the second contact plug 330 through the second contact hole CNT2, may contact the second gate pattern 730 through the fifteenth contact hole CNT15a, and may contact the sixth electrode 155c through the fourteenth contact hole CNT14a. Accordingly, the second electrode 151c and the sixth electrode 155c may be electrically connected to each other by the second contact plug 330 and the first connection pattern 451a. In addition, the second gate pattern 730 and the sixth electrode 155c may be electrically connected to each other by the first connection pattern 451a. Because the second gate pattern 730 and the sixth electrode 155c are electrically connected to each other, the blocking function of the second gate pattern 730 can be further enhanced.

The second connection pattern 453a may contact the third contact plug 350 through the eighth contact hole CNT8a, may contact the first gate pattern 710 through the ninth contact hole CNT9a, and may contact the fourth electrode 153c through the tenth contact hole CNT10a. Accordingly, the first gate electrode 121 and the fourth electrode 153c may be electrically connected to each other by the third contact plug 350 and the second connection pattern 453a. In addition, the first gate pattern 710 and the fourth electrode 153c may be electrically connected to each other by the second connection pattern 453a. Because the first gate pattern 710 and the fourth electrode 153c are electrically connected to each other, the blocking function of the first gate pattern 710 can be further enhanced.

The third connection pattern 455a may contact the third electrode 153b through the eleventh contact hole CNT11a, and may contact the fifth electrode 155b through the thirteenth contact hole CNT13a. Accordingly, the third electrode 153b and the fifth electrode 155b may be electrically connected to each other by the third connection pattern 455a.

The fourth connection pattern 457a may contact the first contact plug 310 through the fifth contact hole CNT5a, and the fifth connection pattern 459a may contact the fourth contact plug 370 through the seventeenth contact hole CNT17a.

A fifth insulating layer 139 may be located on the third conductive layer 400.

A fourth conductive layer 500 may be located on the fifth insulating layer 139. The fourth conductive layer 500 may include a data line 510, which carries a data signal D[j] (see FIG. 2).

A sixth insulating layer 141 may be located on the fourth conductive layer 500.

A third contact hole CNT3a partially exposing the first connection pattern 451a, a sixth contact hole CNT6a partially exposing the fourth connection pattern 457a, an eighteenth contact hole CNT18a partially exposing the fifth connection pattern 459a, and a twelfth contact hole CNT12a partially exposing the third connection pattern 455a may be formed in the fifth insulating layer 139 and the sixth insulating layer 141.

A fifth conductive layer 600 may be located on the sixth insulating layer 141. The fifth conductive layer 600 may include a driving voltage line 610, which carries a driving voltage ELVDD (see FIG. 2), and may further include an upper initialization power line 630, which carries the initialization power VINT (see FIG. 2) to the initialization power line 210. In addition, the fifth conductive layer 600 may further include a first conductive pattern 651 and a second conductive pattern 653.

The driving voltage line 610 may extend along the second direction DR2, which is the column direction. The driving voltage line 610 may be electrically connected to the first electrode 151b of the first switching element T1. In some embodiments, the driving voltage line 610 may contact the fourth connection pattern 457a through the sixth contact hole CNT6a. Accordingly, the driving voltage line 610 and the first electrode 151b may be electrically connected to each other by the first contact plug 310 and the fourth connection pattern 457a.

The upper initialization power line 630 may extend along the second direction DR2, which is the column direction, and may be spaced apart from the driving voltage line 610. The upper initialization power line 630 may be electrically connected to the initialization power line 210. In some embodiments, the upper initialization power line 630 may contact the fifth connection pattern 459a through the eighteenth contact hole CNT18a. Accordingly, the upper initialization power line 630 and the initialization power line 210 may be electrically connected to each other by the fourth contact plug 370 and the fifth connection pattern 459a.

The first conductive pattern 651 may be electrically connected to the second electrode 151c of the first switching element T1. In some embodiments, the first conductive pattern 651 may contact the first connection pattern 451a through the third contact hole CNT3a. Accordingly, the second electrode 151c and the first conductive pattern 651 may be electrically connected to each other by the second contact plug 330 and the first connection pattern 451a.

The second conductive pattern 653 may be electrically connected to the fifth electrode 155b of the third switching element T3 or the third electrode 153b of the second switching element T2. In some embodiments, the second conductive pattern 653 may contact the third connection pattern 455a through the twelfth contact hole CNT12a. Accordingly, the second conductive pattern 653 may be electrically connected to the fifth electrode 155b or the third electrode 153b by the third connection pattern 455a.

The second conductive pattern 653 may form a second capacitor Cpr by overlapping the data line 510 with the sixth insulating layer 141 interposed between them.

A seventh insulating layer 143 may be located on the fifth conductive layer 600.

In some embodiments, the seventeenth contact hole CNT17 of the previous embodiment, which partially exposes the first conductive pattern 651, may be formed in the seventh insulating layer 143.

A first element electrode 810 may be located on the seventh insulating layer 143.

A pixel defining layer 145 defining emission areas may be located on the seventh insulating layer 143 on which the first element electrode 810 is formed.

A light emitting layer 830 may be located on the first element electrode 810 in an area surrounded by the pixel defining layer 145, and a second element electrode 850 may be located on the light emitting layer 830. In some embodiments, the second element electrode 850 may be a cathode.

The first element electrode 810, the light emitting layer 830, and the second element electrode 850 form a light emitting device EL.

In the display device according to the current embodiment, the second switching element T2 and the third switching element T3 may be located on a different layer from the first switching element T1, but may overlap the first switching element T1. This is advantageous in terms of space utilization and in realizing a high-resolution display device. In addition, because the gate pattern layer (710 and 730) is located under the upper semiconductor layer (153 and 155), it is possible to block a gate signal transmitted to the first gate electrode 121 and an initialization signal transmitted to the initialization power line 210 from affecting the second switching element T2 and the third switching element T3. Therefore, a high-resolution structure can be realized, and deterioration of display quality can be reduced or prevented.

According to embodiments, it is possible to provide a display device having high resolution.

In addition, according to embodiments, it is possible to provide a display device capable of improving display quality by reducing or preventing degradation of transistor characteristics in a high-resolution structure.

However, the effects of the embodiments are not restricted to those set forth herein. The above and other effects of the embodiments will become more apparent to one of daily skill in the art to which the embodiments pertain by referencing the claims.

While the inventive concept has been particularly illustrated and described with reference to exemplary embodiments thereof, it will be understood by those of ordinary skill in the art that various changes in form and detail may be made therein without departing from the spirit and scope of the inventive concept as defined by the following claims, with functional equivalents thereof to be included. The exemplary embodiments should be considered in a descriptive sense only and not for purposes of limitation.

What is claimed is:

1. A display device comprising:
a substrate;
a first semiconductor pattern on the substrate, and comprising a first channel portion, a first electrode on a side of the first channel portion and electrically connected to a driving voltage line, and a second electrode on the other side of the first channel portion and electrically connected to a light emitting element;
a first insulating layer on the first semiconductor pattern;
a first conductive layer on the first insulating layer, and comprising a first gate electrode overlapping the first channel portion;
a second insulating layer on the first conductive layer;
a second conductive layer on the second insulating layer, and comprising an initialization power line overlapping the first gate electrode;
a third insulating layer on the second conductive layer;
an upper semiconductor layer on the third insulating layer, and comprising:
　a second semiconductor pattern comprising a second channel portion, a third electrode on a side of the second channel portion, and a fourth electrode on the other side of the second channel portion and electrically connected to the first gate electrode; and
　a third semiconductor pattern comprising a third channel portion, a fifth electrode on a side of the third channel portion and electrically connected to the third electrode, and a sixth electrode on the other side of the third channel portion and electrically connected to the second electrode;
a fourth insulating layer on the upper semiconductor layer; and
a third conductive layer on the fourth insulating layer, and comprising a scan line overlapping the second channel portion, and a control signal line overlapping the third channel portion and spaced apart from the scan line, wherein the upper semiconductor layer does not overlap the first gate electrode and the initialization power line.

2. The display device of claim 1, further comprising:
a fifth insulating layer on the third conductive layer;
a fourth conductive layer on the fifth insulating layer, and comprising a data line;
a fifth insulating layer on the fourth conductive layer; and
a fifth conductive layer on the fifth insulating layer, and comprising the driving voltage line electrically connected to the first electrode, and an upper initialization power line electrically connected to the initialization power line.

3. The display device of claim 2, wherein the upper semiconductor layer does not overlap the upper initialization power line.

4. The display device of claim 2, wherein the third conductive layer further comprises a first connection pattern electrically connecting the second electrode and the sixth electrode, a second connection pattern electrically connecting the first gate electrode and the third electrode, a third connection pattern electrically connecting the fourth electrode and the fifth electrode, a fourth connection pattern electrically connecting the driving voltage line and the first electrode, and a fifth connection pattern electrically connecting the upper initialization power line and the initialization power line.

5. The display device of claim 4, further comprising a contact layer buried in the third insulating layer, and comprising a first contact plug contacting the first electrode and the fourth connection pattern, a second contact plug contacting the second electrode and the third connection pattern, a third contact plug contacting the first gate electrode and the second connection pattern, and a fourth contact plug contacting the initialization power line and the fifth connection pattern.

6. The display device of claim 5, wherein an upper surface of at least any one of the first contact plug, the second contact plug, the third contact plug, and the fourth contact plug lies in the same plane with an upper surface of the third insulating layer.

7. The display device of claim 2, wherein the fifth conductive layer further comprises a conductive pattern spaced apart from the driving voltage line and the initialization power line, and overlapping the data line.

8. The display device of claim 7, wherein the conductive pattern is electrically connected to the fourth electrode or the fifth electrode.

9. The display device of claim 2, wherein the fifth conductive layer further comprises a conductive pattern electrically connected to the second electrode.

10. The display device of claim 9, further comprising a sixth insulating layer on the fifth conductive layer, wherein the light emitting element is on the sixth insulating layer and is connected to the conductive pattern.

11. A display device comprising:
a substrate;
a first semiconductor pattern on the substrate, and comprising a first channel portion, a first electrode on a side of the first channel portion and electrically connected to a driving voltage line, and a second electrode on the other side of the first channel portion and electrically connected to a light emitting element;
a first insulating layer on the first semiconductor pattern;
a first conductive layer on the first insulating layer, and comprising a first gate electrode overlapping the first channel portion;
a second insulating layer on the first conductive layer;
a second conductive layer on the second insulating layer, and comprising an initialization power line overlapping the first gate electrode;
a third insulating layer on the second conductive layer;
a gate pattern layer on the third insulating layer, and comprising a first gate pattern and a second gate pattern, each overlapping the first gate electrode or the initialization power line;
a fourth insulating layer on the gate pattern layer;
an upper semiconductor layer on the fourth insulating layer, and comprising:
a second semiconductor pattern comprising a second channel portion, a third electrode on a side of the second channel portion, and a fourth electrode on the other side of the second channel portion and electrically connected to the first gate electrode; and
a third semiconductor pattern comprising a third channel portion, a fifth electrode on a side of the third channel portion and electrically connected to the third electrode, and a sixth electrode on the other side of the third channel portion and electrically connected to the second electrode;
a fifth insulating layer on the upper semiconductor layer; and
a third conductive layer on the fifth insulating layer, and comprising a scan line overlapping the second channel portion, and a control signal line overlapping the third channel portion and spaced apart from the scan line,
wherein the second semiconductor pattern overlaps the first gate pattern, and wherein the third semiconductor pattern overlaps the second gate pattern.

12. The display device of claim 11, wherein the first gate pattern is electrically connected to the fourth electrode, and wherein the second gate pattern is electrically connected to the sixth electrode.

13. The display device of claim 11, wherein the third conductive layer further comprises:
a first connection pattern that electrically connects the second electrode, the sixth electrode, and the second gate pattern;
a second connection pattern that electrically connects the first gate electrode, the first gate pattern and the fourth electrode;
a third connection pattern that electrically connects the third electrode and the fifth electrode;
a fourth connection pattern that electrically connects the driving voltage line and the first electrode; and
a fifth connection pattern electrically connected to the initialization power line.

14. The display device of claim 13, wherein the first connection pattern contacts the sixth electrode and the second gate pattern, wherein the second connection pattern contacts the fourth electrode and the first gate pattern, wherein the third connection pattern contacts the third electrode and the fifth electrode, and wherein the fourth connection pattern contacts the driving voltage line.

15. The display device of claim 13, further comprising:
a sixth insulating layer on the third conductive layer;
a fourth conductive layer on the sixth insulating layer, and comprising a data line;
a seventh insulating layer on the fourth conductive layer; and
a fifth conductive layer on the seventh insulating layer, and comprising the driving voltage line contacting the fourth connection pattern, and an upper initialization power line contacting the fifth connection pattern.

16. The display device of claim 15, further comprising a contact layer buried in the third insulating layer, wherein the contact layer comprises a first contact plug contacting the first electrode and the fourth connection pattern, a second contact plug contacting the second electrode and the first connection pattern, a third contact plug contacting the first gate electrode and the second connection pattern, and a fourth contact plug contacting the initialization power line and the fifth connection pattern.

17. The display device of claim 16, wherein an upper surface of at least any one of the first contact plug, the second contact plug, the third contact plug, and the fourth contact plug lies in the same plane with an upper surface of the third insulating layer.

18. The display device of claim 15, wherein the fifth conductive layer further comprises a conductive pattern spaced apart from the driving voltage line and the initialization power line, and overlaps the data line, wherein the conductive pattern contacts the third connection pattern.

19. The display device of claim 15, wherein the fifth conductive layer further comprises a conductive pattern contacting the first connection pattern.

20. The display device of claim 19, further comprising a sixth insulating layer on the fifth conductive layer, wherein the light emitting element is on the sixth insulating layer and is connected to the conductive pattern.

* * * * *